United States Patent [19]

Nakagawa et al.

[11] Patent Number: 5,599,743
[45] Date of Patent: Feb. 4, 1997

[54] METHOD OF MANUFACTURING A SEMICONDUCTOR DEVICE

[75] Inventors: Satoshi Nakagawa, Muko; Youji Bitou, Kyoto, both of Japan

[73] Assignee: Matsushita Electronics Corporation, Osaka, Japan

[21] Appl. No.: 418,474

[22] Filed: Apr. 7, 1995

[30] Foreign Application Priority Data

Apr. 7, 1994 [JP] Japan .................................. 6-069465

[51] Int. Cl.⁶ ............................ H01L 21/44; H01L 21/48
[52] U.S. Cl. ...................... 437/194; 437/195; 156/643.1; 156/646.1
[58] Field of Search ...................... 437/195; 156/643.1, 156/646.1

[56] References Cited

U.S. PATENT DOCUMENTS

| | | | |
|---|---|---|---|
| 5,200,031 | 4/1993 | Latchford et al. | 156/659.1 |
| 5,221,424 | 6/1993 | Rhoades | 156/643 |

FOREIGN PATENT DOCUMENTS

| | | |
|---|---|---|
| 0385590 | 5/1990 | European Pat. Off. . |
| 0416774 | 8/1990 | European Pat. Off. . |
| 57-24439 | 8/1982 | Japan . |
| 1250185 | 11/1986 | Japan . |
| 1023633 | 1/1991 | Japan . |
| 3136240 | 6/1991 | Japan . |
| 3188628 | 8/1991 | Japan . |
| 6-232093 | 8/1994 | Japan . |

Primary Examiner—Tom Thomas
Assistant Examiner—Lynne A Gurley
Attorney, Agent, or Firm—Fish & Richardson PC

[57] ABSTRACT

A manufacturing method of a semiconductor device including the steps of forming an insulating film on a semiconductor substrate, further laminating an aluminum film or an alloy film primarily containing aluminum, forming a mask having a certain pattern on the aluminum film or the alloy film primarily comprising aluminum, removing the aluminum film or the alloy film primarily comprising aluminum by etching the film by chlorination and/or bromination with plasma except the part on which the mask is formed, exposing the film to a gas plasma not liable to deposit or oxidize but capable of substituting fluoride for chloride and/or bromide, or to a gas mixture plasma comprising hydrogen and the above-mentioned gas, washing with water, and removing the mask to provide a manufacturing method of a semiconductor devices which can prevent the occurence of defective goods caused by the corrosion of interconnections comprising an aluminum film, or an alloy film primarily comprising aluminum, reduce manufacturing cost, improve the yield rate and reliability of the semiconductor device.

6 Claims, 3 Drawing Sheets

METHOD OF MANUFACTURING A SEMICONDUCTOR DEVICE

BACKGROUND OF THE INVENTION

1. Field of the Invention

This invention relates to a method of manufacturing semiconductor devices. More particularly, this invention relates to an interconnection pattern formation utilizing an aluminum film or an alloy film primarily comprising aluminum in the semiconductor device manufacture.

2. Description of the Prior Art

Conventional semiconductor devices comprising an insulating film on a semiconductor substrate, further comprising an aluminum film or an alloy film primarily comprising aluminum with a desired interconnection pattern formed thereon have been broadly used.

A conventional method of manufacturing a semiconductor device will be explained below with reference to the figures. FIGS. 3(a)–(d) illustrate a diagram of each stage of the conventional manufacturing process of a semiconductor device. In FIGS. 3(a)–(d), numeral 1 denotes a semiconductor substrate, 2 an insulating film, 3 an aluminum film or alloy film primarily comprising aluminum (hereinafter abbreviated "Al film"), 4 a mask comprising a photo resist film, 5 a deposited film.

First, an insulating film 2 is formed on a semiconductor substrate 1, and an Al film 3 is laminated thereon by a suitable method such as sputtering. Consecutively, a mask 4 comprising a photo resist film which processes the Al film 3 into a desired pattern is formed (FIG. 3(a)). Then plasma etching with a gas mixture of $Cl_2$ and $BCl_3$ is applied to the Al film 3. By the plasma etching, a part of the Al film not having the mask 4 formed thereon is chlorinated and removed. At that time, a deposited film of reaction product 5 primarily comprising aluminum chloride ($AlCl_3$) is deposited on the sides of the mask 4 or the patterned Al film 3 thereunder (FIG. 3(b)). Then, plasma electric discharge is applied in the presence of $CF_4$ gas or $CHF_3$ gas to prevent the corrosion of the Al film 3. By the plasma electric discharge, the deposited film of reaction product 5 of chloride is substituted for fluoride (FIG. 3(c)). Then an ashing treatment is carried out by applying oxygen plasma to the mask 4 of a photo resist film to remove the mask 4, and a patterned interconnection comprising Al film 3 is formed (FIG. 3(d)).

The above-mentioned conventional technique of corrosion prevention treatment on the Al film 3 with a plasma of $CF_4$ gas or $CHF_3$ gas is not sufficient, and in many cases chloride tends to remain and corrodes the Al film 3. In addition, the deposited film of reaction product 5 is oxidized by the ashing treatment with oxygen plasma to become aluminum oxide and thus, becomes slightly soluble in water and difficult to remove. For such reasons, the deposited film of reaction product 5 causes defective interconnection pattern. Moreover, since it is often necessary to remove the aluminum oxide film by washing with a chemical that requires an industrial waste water treatment, such as acid, alkali, or an organic solvent, production cost tends to become higher.

SUMMARY OF THE INVENTION

It is an object of the present invention to provide a method of manufacturing a semiconductor device which prevents the corrosion of an interconnection comprising an aluminum film, or an alloy film primarily comprising alminum. It is another object of the invention to provide a semiconductor manufacturing method that allows for easy removal of the deposited film of reaction product, prevents the occurence of defective goods caused by residue of the deposited film of reaction product, and that improves the yield rate or reliability of the obtained semiconductor device.

It is another object of the present invention to provide a method of manufacturing a semiconductor device in which the deposited reaction product film can be easily removed by washing with water, and thus can prevent potential environmental pollution from the use of conventional chemicals that are conventionally used to remove the deposited film of reaction product and enables the easy treatment of waste fluid used for washing, and consequently reduces the production cost.

It is still another object of the present invention to provide a method of manufacturing a semiconductor device which results in improved corrosion prevention in the interconnection and which comprises an aluminum film or an alloy film primarily comprising aluminum.

A further object of the present invention is to provide a method of manufacturing a semiconductor device which does not need equipment for explosion-proofing or exhaust management for fire prevention, thus reducing the equipment cost.

These and other objects and advantages of the invention are achieved by a method of manufacturing a semiconductor device comprising the steps of: forming an insulating film on a semiconductor substrate, laminating an aluminum film or an alloy film primarily comprising aluminum, forming a mask with a pattern on the aluminum film or the alloy film primarily comprising aluminum, removing the alminum film or the alloy film primarily comprising aluminum by etching the film by chlorination and/or bromination with plasma except the part on which the mask is formed, exposing to a gas plasma that does not have a depositing or oxidizing effect but which is capable of substituting fluoride for chloride and/or bromide or to a gas mixture plasma comprising hydrogen and a gas plasma that does not have a depositing or oxidizing effect but which is capable of substituting fluoride for chloride and/or bromide, washing with water, and removing the mask.

Further, in the above-mentioned method of manufacturing a semiconductor device of the invention, it is preferable that the gas that does not have a depositing or oxidizing effect but which is capable of substituting a fluoride for a chloride and/or a bromide under plasma state comprises at least one gas selected from the group consisting of $CF_4$, $NF_3$ and $SF_6$.

In the method of manufacturing a semiconductor device of the invention, when a gas mixture comprising hydrogen is used, the hydrogen concentration is preferably from 0.1 to 50 volume %, more preferably from 1 to 4 volume %.

Since the corrosion prevention treatment with a gas plasma that does not deposit or oxidize but which is capable of substituting fluoride for chloride and/or a bromide is applied in the invention, the deposited film of the reaction product is water-soluble and is not liable to be covered with a hydrophobic film, the deposited film of the reaction product can be easily removed by washing with water. Furthermore, by adding hydrogen gas at the gas plasma treatment, residual chlorine or residual bromine in the deposited reaction product reacts with hydrogen to form hydrogen chloride (HCl) or hydrogen bromide (HBr), and thus the vapor pressure becomes higher than $Cl_2$ or $CCl_4$, $Br_2$ or $CBr_4$ to accelerate air exhaustion and to further reduce the amount of resudual chlorine or residual bromine and improve the corrosion prevention effect.

Moreover, since the effect of further reducing the amount of residual chlorine or residual bromine can be achieved even when the hydrogen gas concentration in the gas plasma treatment is less than 4 volume % which is below the explosion limit, equipment for explosion-proofing or exhaust management for fire prevention is not necessary, therefore the equipment cost can be reduced.

DESCRIPTION OF THE PREFERRED EMBODIMENTS

Figure 1A:
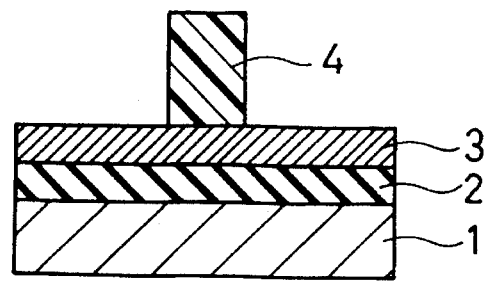
FIGS. 1(a)–(e) are sectional diagrams illustrating the method of manufacturing a semiconductor device of one embodiment of the invention.
Figure 1B:
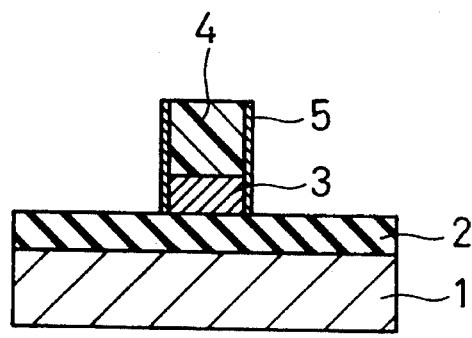
Figure 1C:
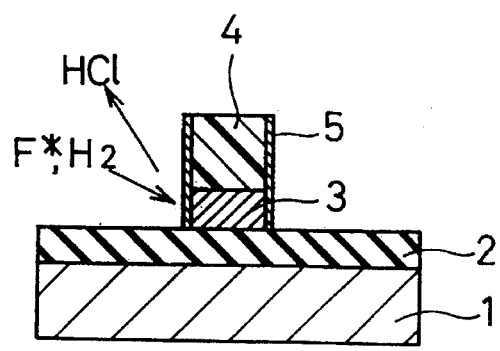
Figure 1D:
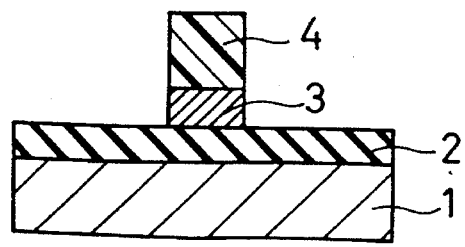
Figure 1E:
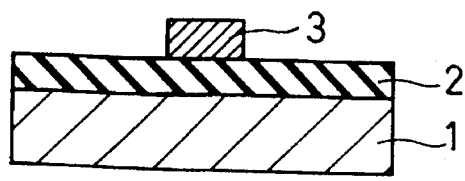

In the invention, the kind of semiconductor substrate is not limited. Any suitable type of semiconductor substrate can be used. In general, a silicon semiconductor is most commonly used.

The thickness of the semiconductor substrate is not particularly limited. In general, a substrate having a thickness of 0.5 to 1 mm, preferably 0.6 to 0.8 mm is used.

As an insulating film formed on the semiconductor substrate, any material commonly used in this kind of a semiconductor device can be used. An electrically insulated film comprising an inorganic material which can barely be etched by plasma treatment is preferable. More particularly, $SiO_2$ and $Si_3N_4$ are preferable. Although the thickness of the insulating film is not specifically limited and varies depending on the kind of the semiconductor device, it is generally from 0.3 to 2 μm. Although the method of forming the insulating film on the semiconductor substrate is not particularly limited, preferably a method such as CVD (Chemical Vapor Deposition) is used.

As an alloy film primarily comprising aluminum, an alloy of aluminum with Si and/or Cu is preferably used depending on the application. "An alloy film primarily comprising aluminum" herein contains at least 95 weight % of aluminum. When aluminum alloy containing Si is used, the mixing ratio of Si to the aluminum alloy is preferably from 0.5 to 1 weight %, and when aluminum alloy containing Cu is used, the mixing ratio of Cu to the aluminum alloy is preferably from 0.1 to 4 weight %. The mixing ratio most commonly employed is, 1 weight % for Si, 0.5 weight % for Cu. Si and Cu can be incorporated into the aluminum alloy at the same time. The methods for forming an aluminum film or an alloy film comprising aluminum is not particularly limited. Commonly, methods such as sputtering are preferably used. The thickness of the aluminum film or alloy film primarily comprising aluminum can generally be any thickness sufficient for the semiconductor device. Although not particularly limited, the thickness is generally from 0.5 to 1.2 μm.

As a mask used for plasma etching of the Al film, various kinds of a photo resist films used to form interconnection patterns can be used. Although the kind is not particularly limited, in general, positive type photo resist films have good resistance to dry etching, and positive type photo resist primarily comprising novolak resin are particularly preferable. The thickness of the photo resist film is not limited since it varies depending on the kind of the photo resist or the kind of the semiconductor device to be applied. Generally, it is approximately 1 to 3 μm.

The technique for plasma etching to chlorinate and/or brominate the part of the Al film not covered with a mask comprising the photo resist film is not particularly limited, but when chlorinating, a plasma electric discharge with a gas mixture comprising $BCl_3$ and $Cl_2$ is preferably applied. The mixing ratio of the gas mixture is generally from 10:1 to 1:10 by volume, preferably from 3:1 to 1:3 by volume. The treating conditions of the plasma etching are not particularly limited, but generally, a high frequency electric power having frequency of 50 KHz to 100 MHz, preferably of 10 MHz to 20 MHz, with an electric power density of 0.3 to 5 $W/cm^2$, preferably of 1 to 3.5 $W/cm^2$ is applied with the flow of $BCl_3$ and $Cl_2$ of 1 to 200 cc/minute each, preferably 10 to 100 cc/minute each with the pressure of 1 to 3000 mTorr, preferably of 50 to 500 mTorr. When brominating, $BBr_3$ is used instead of $BCl_3$, and HBr is used instead of $Cl_2$. When both brominating and chlorinating, a plasma etching in an atmosphere including chlorine and bromine, such as a gas mixture of $BBr_3$ and $Cl_2$, or a gas mixture of $BCl_3$ and HBr can be applied.

Gases not that do not deposit or oxidize but which are capable of substituting fluoride for chloride and/or bromide include gases capable of forming a fluorine radical and capable of substituting aluminum fluoride for aluminum chloride and/or aluminum bromide in the plasma state, and not liable to deposit or oxidized. "A gas not liable to deposit" herein denotes a gas which scarcely deposits or does not deposit a water-insoluble polymer on the surface of the deposited film of the reaction product at the time of the plasma treatment. "A gas not liable to oxidize" in this invention denotes a gas which scarecely oxidizes, or does not oxidize the object to be treated in the plasma state. Concrete examples of suitable gases include a gas comprising at least one gas selected from the group consisting of $CF_4$, $NF_3$, $SF_6$. Since such gases can be easily handled and attain the effects of the invention in a wide range of plasma generating conditions, they are preferable. Further, hydrogen can be preferably added to these gases, since the amount of the residual chlorine or the residual bromine in the deposited film of reaction product can be further reduced, and corrosion prevention in the Al film can be further improved. When a gas mixture containing hydrogen is used, the concentration of hydrogen is generally 0.1 to 50 volume %, preferably 1 to 4 volume %. Since the effect of further reducing the amount of the residual chlorine or the residual bromine can be attained even when the hydrogen gas concentration in the plasma treatment in the mixed gas atmosphere is less than 4 volume % which is below the explosion limit, equipment for explosion-proofing or exhaust management for fire prevention is not necessary. This saves equipment costs, and thus is particularly preferable. It is also preferable to use $N_2$ gas to dilute the hydrogen gas to a concentration below the explosion limit.

Since conditions of the above-mentioned plasma treatment change according to the device to be used for plasma treatment, the general conditions are not particularly limited. In general, a high frequency electric power having frequency of 50 KHz to 100 MHz, preferably of 10 MHz to 20 MHz with an electric power density of 0.3 to 3 W/cm$^2$, preferably of 0.5 to 2 W/cm$^2$ is applied with the gas flow of 1 to 1000 cc/minute, preferably 50 to 200 cc/minute, and a pressure of 50 to 3000 mTorr, preferably 1000 to 2000 mTorr.

An example of the manufacturing process of a semiconductor device of the invention will be illustrated hereinafter referring to the drawings. This invention is not in any way limited by the embodiment described in this example.

EXAMPLE

FIG. 1 is a sectional diagram describing each stage of a manufacturing method of a semiconductor device of one embodiment in the present invention. In the FIGS. 1(a) to (e), numeral 1 denotes a semiconductor substrate, 2 an insulating film, 3 an aluminum alloy film or an alloy film primarily comprising aluminum (Al film), 4 a mask comprising a photo resist film, 5 a deposited film of a reaction product, respectively.

Firstly, insulating film 2 was formed on a semiconductor substrate 1 and Al film 3 of 800 nm thickness was laminated thereon by sputtering. Next, a mask comprising photo resist film 4 to process the Al film 3 into a certain pattern was formed (FIG. 1(a)). Then the Al film 3 was etched with plasma in a gas mixture of $Cl_2$ and $BCl_3$. By this plasma etching, the part of the Al film on which the mask 4 was not formed was chlorinated and removed. Thus, a deposited film of reaction product 5 mainly comprising aluminum chloride ($AlCl_3$) was deposited on the side plane of the mask 4 or the patterned Al film 4 (FIG. 1(b)). If brominated, the primary component of the deposited film of reaction product 5 mainly comprises aluminum bromide ($AlBr_3$) and when treated with both chloride and bromide, the component mainly comprises $AlCl_3$ and $AlBr_3$. Then plasma electric discharge was applied under the presence of a gas mixture of $CF_4$ and $H_2$ to prevent the corrosion of Al film 3. By the plasma electric discharge, the deposited film of reaction product 5 of chloride was substituted with fluoride. At the time, chlorine reacted with hydrogen to form and exhaust HCl (FIG. 1(c)). The mark "F*" in the figure diagramically denotes fluorine radical generated by plasma electric discharge. Next, the deposited film of reaction product 5 was washed with water running at the rate of 1 liter per minute to be dissolved and removed (FIG. 1(d)). After the washing step, an ashing treatment with oxygen plasma was applied to the mask comprising a photo resist film 4 to remove the mask comprising a photo resist film 4, and then an interconnection comprising the patterned Al film 3 was formed (FIG. 1(e)).

In the above procedure, if the ashing treatment with oxygen plasma is implemented before the step of washing with water, the deposited film of reaction product 5 mainly comprises alminum oxide, which is slightly soluble in water, thus can not be removed by washing with water.

In the above example, a semiconductor substrate comprising silicon single crystal having 625 μm thickness was used as the semiconductor substrate 1, an $SiO_2$ film having 0.8 μm thickness was used as the insulating film 2, an alloy film comprising primarily aluminum and 0.5 weight % of Cu and 1 weight % of Si having 0.8 μm thickness was used as the Al film 3, a mask of positive type photo resist primarily comprising novolak resin ("S-1400" produced by Shipley Company) having about 1.5 μm thickness was used as the mask comprising photo resist film 4. The ashing treatment with oxygen plasma was applied on the mask 4 comprising photo resist film under the conditions that the high frequency electric power of 13.56 MHz with the electric power density of 1 W/cm$^2$ was applied with the flow of $O_2$ supply of 800 cc/minute with the pressure of 500 mTorr. The conditions of plasma etching under the presence of a mixed gas of $Cl_2$ and $BCl_3$ were that the high frequency electric power of 13.56 MHz with the electric power density of 2.5 W/cm$^2$ was applied with the flow of $Cl_2$ supply of 30 cc/minute and the flow of $BCl_3$ supply of 20 cc/minute with the pressure of 250 mTorr. The conditions of plasma electric discharge under the presence of a gas mixture of $CF_4$ and $H_2$ were that the high frequency electric power of 13.56 MHz with the electric power density of 1 W/cm$_2$ was applied with the flow of $CF_4$ supply of 97 cc/minute and the flow of $H_2$ supply of 3 cc/minute with a pressure of 1500 mTorr.

Figure 2:
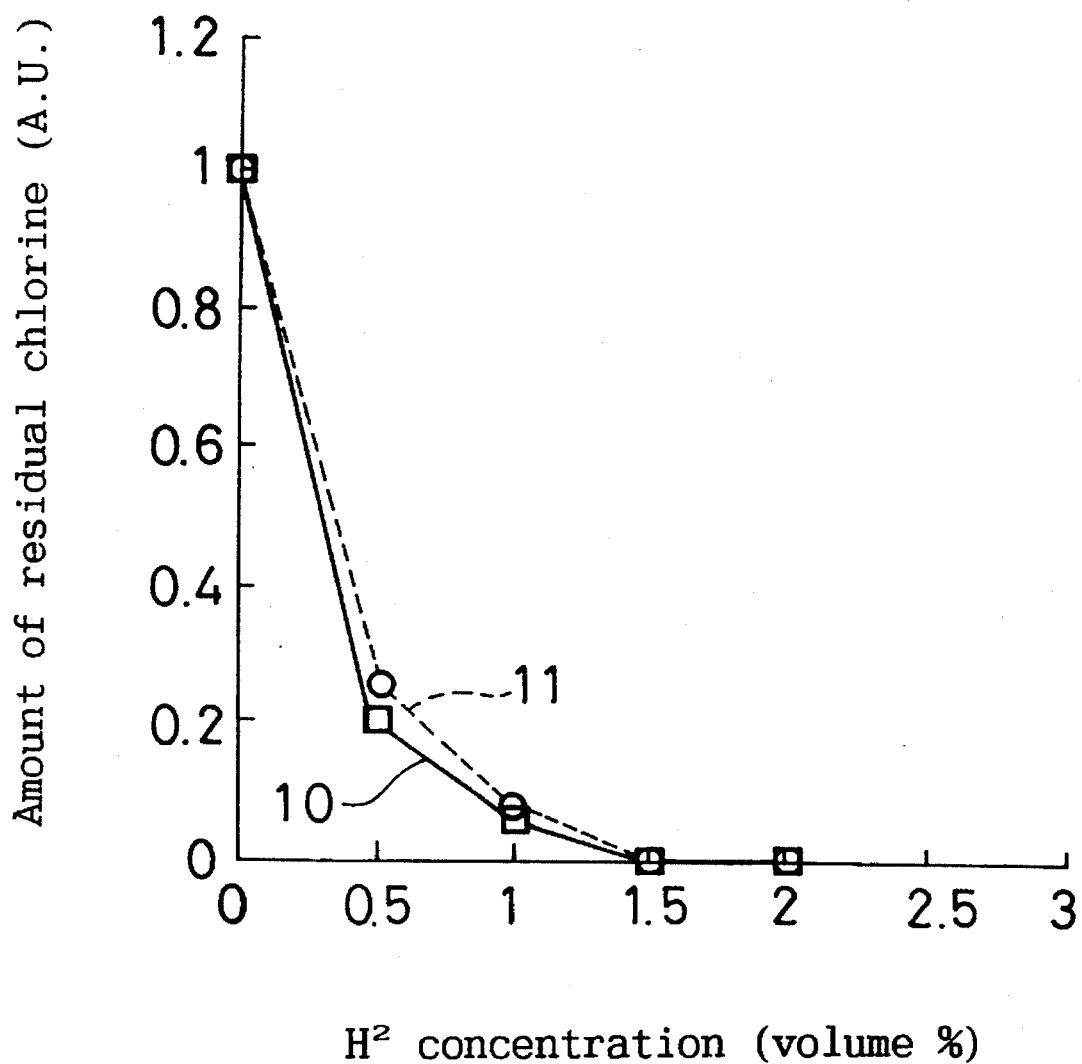
FIG. 2 is a graph illustrating the relation between the mixing ratio of $H_2$ gas to the $CF_4$ gas and the amount of the residual chlorine on the surface of the treated semiconductor device in the method of manufacturing the semiconductor device of one embodiment of the present invention.
Figure 3A:
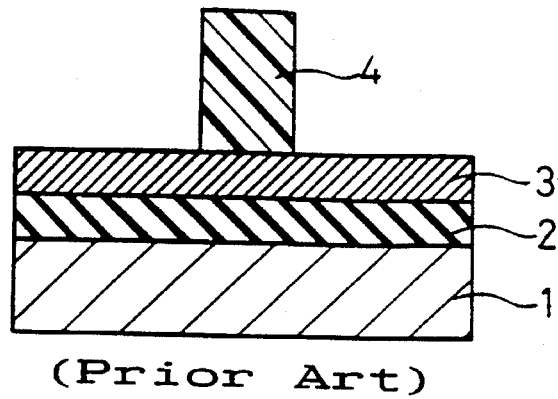
FIGS. 3(a)–(d) are sectional diagrams illustrating the conventional method of manufacturing a semiconductor device.
Figure 3B:
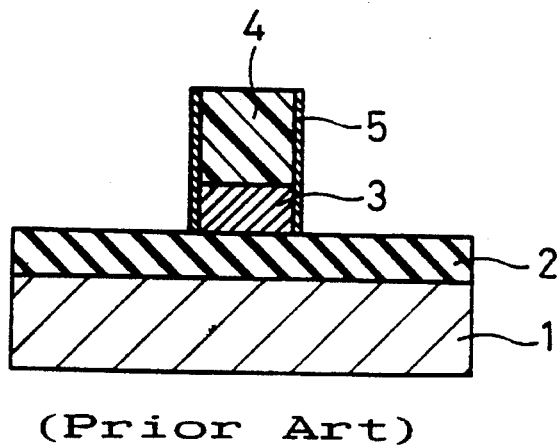
Figure 3C:
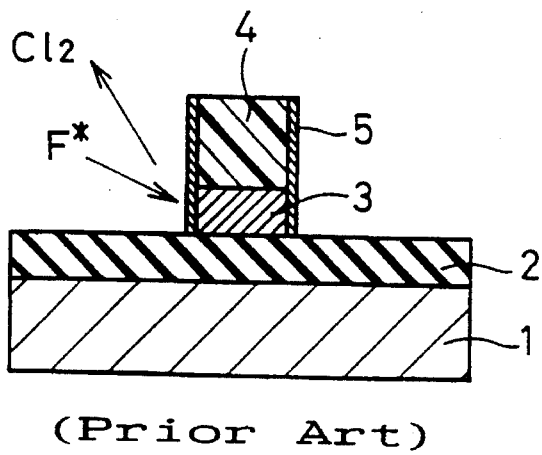
Figure 3D:
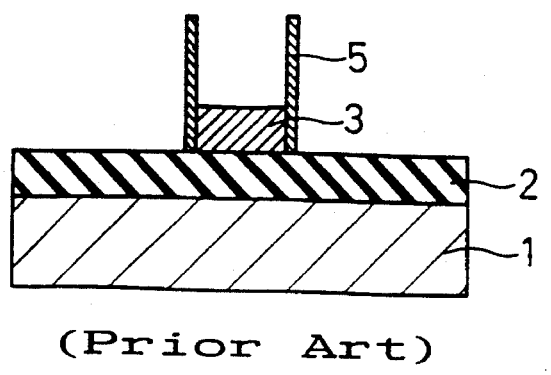

Next, the effects of the example will be explained referring to drawings. FIG. 2 describes the relationship between the mixing ratio of $H_2$ gas to $CF_4$ gas and the amount of the residual chlorine on the surface of the treated substrate. The amount of residual chlorine on the surface of the treated substrate was determined by soaking the semiconductor device processed to the stage shown in the FIG. 1(c) in 20 cc pure water for 30 minutes to extract chlorine ion and measuring the amount of the chlorine ion by ion chromatography. The amount of the residual chlorine is described on a relative basis to the amount of chlorine at the time $H_2$ gas is 0% as 1. The solid line 10 illustrates the amount when treated with the gas mixture of $CF_4$ and $H_2$ and the dotted line 11 illustrates the amount when treated with the gas mixture of $CF_4$ and $H_2$ diluted with $N_2$. As the $H_2$ gas diluted with $N_2$, a gas having an $H_2$ gas concentration of 3 volume % was used. In the graph, the dotted line 11 denotes the relationship of hydrogen concentration and the amount of residual chlorine when treated with gas mixtures of various mixing ratio of (P) and (Q) wherein (P) comprises 3 volume % of $H_2$ and 97 volume % of $N_2$, and (Q) comprises 100 volume % of $CF_4$ gas.

The amount of the residual chlorine decreases as the $H_2$ gas concentration increases in either kind of gas. This is because chlorine contained in the deposited film of reaction product 5 reacts with hydrogen to form HCl, thereby increasing the vapor pressure to facilitate the exhaustion of chlorine from the deposited film of reaction product 5.

When $H_2$ gas concentration exceeds 1 volume %, the amount of the residual chlorine decreases to the extent less than one-tenth of the amount of the residual chlorine treated with 100 volume % of $CF_4$ gas, and when the $H_2$ gas concentration exceeds 1.5 volume %, the residual chlorine is very little and becomes less than the detection limit.

By applying such plasma treatment with the atmosphere mixture comprising $CF_4$ gas preferably with 1 volume % or more of $H_2$ gas, the amount of residual chlorine can be decreased to improve the corrosion prevention effect of the aluminum alloy film pattern.

The effects of the example will be explained referring to the Table 1.

TABLE 1

| No. | Kind of Gas | Deposited film of reaction product | Example/Comparative Example |
|---|---|---|---|
| 1 | $CF_4$ | Removed | Ex |
| 2 | $SF_6$ | Removed | Ex |
| 3 | $NF_3$ | Removed | Ex |
| 4 | $CHF_3$ | Present | Co |
| 5 | $CF_4 + H_2$ | Removed | Ex |

TABLE 1-continued

| No. | Kind of Gas | Deposited film of reaction product | Example/Comparative Example |
|---|---|---|---|
| 6 | $SF_6 + H_2$ | Removed | Ex |
| 7 | $NF_3 + H_2$ | Removed | Ex |
| 8 | $CHF_3 + H_2$ | Present | Co |
| 9 | $CF_4 + H_2 + N_2$ | Removed | Ex |
| 10 | $SF_6 + H_2 + N_2$ | Removed | Ex |
| 11 | $NF_3 + H_2 + N_2$ | Removed | Ex |
| 12 | $CHF_3 + H_2 + N_2$ | Present | Co |
| 13 | $CF_4 + O_2$ | Present | Co |
| 14 | $SF_6 + O_2$ | Present | Co |
| 15 | $NF_3 + O_2$ | Present | Co |
| 16 | $CHF_3 + O_2$ | Present | Co |

Note: "Ex" denotes Example of this invention and "Co" denotes Comparative Example.

Table 1 illustrates the removal effect of the deposited film of reaction product by treatment with various kinds of gases used in the plasma treatment for corrosion prevention of the aluminum alloy film followed by washing with water. After processing to the stage described in the FIG. 1(d), the state of the deposited film of residual reaction product 5 was observed with a scanning electron microscope. "Removed" denotes when the deposited film of residual reaction product 5 was removed, and "Present" denotes when the product remained.

When gases not liable to deposit such as $CF_4$, $SF_6$, $NF_3$ were used, the deposited film of reaction product 5 was removed, and when the gases not liable to deposit further containing $H_2$ or $N_2$ were used, the deposited film of reaction product 5 was removed as well. However, when gases liable to deposit such as $CHF_3$ or when gases liable to deposit further containing $H_2$ or $N_2$ are used as illustrated in the Comparative Examples of Table 1, the deposited film of reaction product 5 remained. That is, when gases liable to deposit were used, C—F type polymer (polymer comprising carbon and fluorine) deposits on the surface of the deposited film of reaction product and prevents contact between the water used for washing and the deposited film of reaction product, which interferes with the dissolution of the deposited film of reaction product in the water. On the other hand, whenever a gas containing $O_2$ having an oxidization effect is used, the deposited film of the residual reaction product remained as shown in the Nos. 13 to 16 in the Table 1. Since a corrosion prevention treatment having an oxidizing effect oxidizes the deposited film of reaction product, it forms a film primarily comprising alminum oxide which is only slightly soluble in water. By applying a corrosion prevention treatment with plasma electric discharge with a gas which is not liable to deposit or oxidize but which is capable of substituting fluoride for chloride and/or bromide, the deposited film of the reaction product can be readily removed by washing with water.

The plasma electric discharge treatment of Table 1 was conducted under the conditions of applying a high frequency electric power of 13.56 MHz with an electric power density of 1 $W/cm^2$ under a pressure of 1500 mTorr. In Nos. 1 to 4, the supply flow of $CF_4$, $SF_6$, $NF_3$, $CHF_3$ was 100 cc/minute respectively; in Nos. 5 to 8, the supply flow of $CF_4$, $SF_6$, $NF_3$, $CHF_3$ was 97 cc/minute respectively and the supply flow of $H_2$ was 3 cc/minute; in Nos. 9 to 12, the supply flow of $CF_4$, $SF_6$, $NF_3$, $CHF_3$ was 97 cc/minute respectively, the supply flow of $H_2$ was 3 cc/minute, and the supply flow of $N_2$ was 97 cc/minute; in Nos. 13 to 16, the supply flow of $CF_4$, $SF_6$, $NF_3$, $CHF_3$, was 90 cc/minute respectively, and the supply flow of $O_2$ was 10 cc/minute.

Although an example of a method of manufacturing a semiconductor device according to the invention was described, the shape, thickness, composition of the Al film or the insulating film are not limited to the embodiment of the examples. Similarly, the kind of gas used in the corrosion prevention step is not limited to the gases disclosed herein, and any gas which does not deposit or oxidize and which is capable of substituting fluoride for chloride and/or bromide can be employed.

The manufacturing method of the semiconductor device of the invention prevents the occurence of defective products caused by the corrosion of the interconnection comprising an aluminum film or an alloy film primarily comprising aluminum, and improves the yield rate and the reliability of the semiconductor device.

Moreover, by applying plasma treatment under the presence of hydrogen gas, the further corrosion prevention effect of the interconnection comprising an aluminum film, or an alloy film primarily comprising aluminum can be attained. Even when hydrogen gas diluted with nitrogen gas to the degree below explosion limit is used, the same effect can be achieved. Therefore equipment for explosion-proofing or exhaust management for fire prevention is not needed. Thus the equipment cost can be reduced.

Further, since the deposited film of reaction product can be readily removed by washing with water, the method contributes to the prevention of potential environmental pollution which can occur by the use of conventional chemicals used for removing the film. Thus, a simpler waste water treatment becomes sufficient. Consequently a method of manufacturing a semiconductor device which enables manufacturing cost reduction can be provided.

What is claimed is:

1. A method of manufacturing a semiconductor device, comprising the steps of:

forming an insulating film on a semiconductor substrate;

forming a film comprising aluminum or an alloy comprising aluminum on said substrate;

providing a mask with a pattern on the film comprising aluminum or the alloy comprising aluminum;

removing the film comprising aluminum or the alloy comprising aluminum by etching the film comprising aluminum or the alloy comprising aluminum by chlorination and/or bromination with plasma except the part of the film comprising aluminum or the alloy comprising aluminum on which the mask is formed;

exposing the film comprising aluminum or the alloy comprising aluminum to a gas mixture plasma comprising hydrogen and a gas that does not have a depositing or oxidizing effect but which substitutes fluoride for chloride and/or bromide;

washing the substrate and the film comprising aluminum or the alloy comprising aluminum with water; and removing the mask.

2. The method of manufacturing a semiconductor device according to claim 1, wherein the gas mixture plasma is a gas mixture plasma comprising hydrogen and at least one gas selected from the group consisting of $CF_4$, $NF_3$ and $SF_6$.

3. The method of manufacturing a semiconductor device according to claim 2, wherein the hydrogen concentration in the gas mixture plasma is from 0.1 to 50 volume %.

4. The method of manufacturing a semiconductor device according to claim 3, wherein the hydrogen concentration of the gas mixture plasma is from 1 to 4 volume %.

5. The method of manufacturing a semiconductor device according to claim 1, wherein the hydrogen concentration in the gas mixture plasma is from 0.1 to 50 volume %.

6. The method of manufacturing a semiconductor device according to claim 5, wherein the hydrogen concentration in the gas mixture plasma is from 1 to 4 volume %.

* * * * *